United States Patent [19]

Wright et al.

[11] 4,135,286
[45] Jan. 23, 1979

[54] SPUTTERING TARGET FABRICATION METHOD

[75] Inventors: Robert J. Wright, Tequesta; Ralph J. Hecht, West Palm Beach; Richard J. Fenton, Palm Beach Shores, all of Fla.

[73] Assignee: United Technologies Corporation, Hartford, Conn.

[21] Appl. No.: 863,120

[22] Filed: Dec. 22, 1977

[51] Int. Cl.² .............................................. B22F 3/24
[52] U.S. Cl. .............................. 29/420; 204/192 R; 204/298; 264/111; 75/226; 75/208 R
[58] Field of Search ............... 29/420, 420.5; 75/226, 75/208 R

[56] References Cited

U.S. PATENT DOCUMENTS

| 3,325,281 | 6/1967 | Ebhardt | 75/226 X |
| 3,334,400 | 8/1967 | Jaeger | 75/208 R |
| 3,573,003 | 3/1971 | Valyi | 75/208 R |
| 3,803,702 | 4/1974 | Bratt et al. | 29/420.5 |
| 3,939,241 | 2/1976 | Powell et al. | 29/420.5 |

*Primary Examiner*—C. W. Lanham
*Assistant Examiner*—V. Rising
*Attorney, Agent, or Firm*—Charles E. Sohl

[57] ABSTRACT

A method for producing a cooled sputtering target assembly is described. The resultant target is also described. The material to be sputtered is provided in the form of powder which is hot isostatically pressed in a toroidal metallic container under conditions which promote compaction and bonding of the powder particles to form a fully dense material. The container is then partially removed from the target material except for a remnant around the outer surface. A cooling jacket is then fabricated and attached to the remnant of the container.

3 Claims, 6 Drawing Figures

SPUTTERING TARGET FABRICATION METHOD

BACKGROUND OF THE INVENTION

1. Field of the Invention

This invention relates to cooled sputtering targets and methods for producing such targets. This invention is also related to the field of hot isostatic pressing.

2. Description of the Prior Art

Sputtering using a hollow cathode is shown in several U.S. patents. Typical of these are U.S. Pats. No. 3,314,873; 3,282,816; and 3,528,902. None of these patents appear to describe target fabrication methods.

U.S. Pat. No. 3,992,202 describes a hot isostatic pressing technique for the fabrication of hollow articles such as cutting tools.

SUMMARY OF THE INVENTION

A method for fabricating a hollow cylindrical sputtering target having a ductile metal component metallurgically bonded to the outer surface of the target and cooling means is described. The target material is a fine grain material formed from powder by compaction at elevated temperatures. A cooling jacket is attached to the outer metal surface. The method of this invention is particularly useful in the fabrication of targets from brittle material.

The foregoing and other objects, features and advantages of the present invention will become more apparent in the light of the following detailed description of preferred embodiments thereof as illustrated in the accompanying drawings.

DESCRIPTION OF PREFERRED EMBODIMENTS

Figure 5:
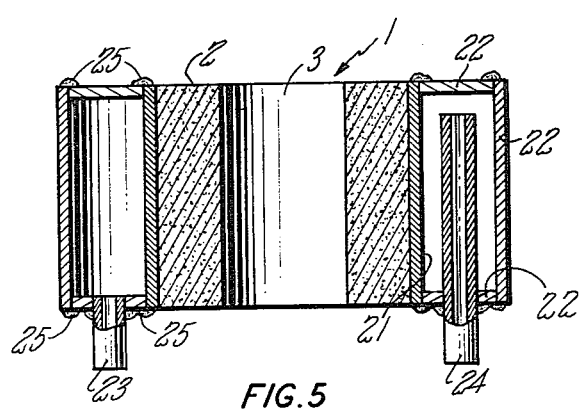
FIG. 5 shows the article of FIG. 4 after the fabrication of the cooling jacket.

This invention relates to a method for fabricating a target assembly and to the resultant target. Such a finished target assembly is shown in FIG. 5. The target assembly 1 has a toroidal shape and is comprised of a plurality of generally cylindrical components. The sputtering process is a well known coating process and is described in U.S. Pat. Nos. 3,314,873; 3,282,816; and 3,528,902 which are incorporated herein by reference. The coating material which is to be applied by sputtering forms the inner component 2 of the finished target assembly 1. The target shown is intended for use in a hollow cathode type of sputtering apparatus in which the item to be sputtered is placed within the aperture 3 in the target and is sputter coated by applying an electric field between the article to be coated and the target in the presence of an appropriate atmosphere. In the particular process employed a second cathode, termed a post cathode, is inserted concentrically within the aperture and the articles to be coated are placed within the annulus between the cathodes. Cathodes made by the method of the invention may be employed in connection with DC and RF sputtering, with reaction sputtering methods, and with sputtering methods employing magnetic fields and/or additional electrodes. Sputtering has historically been considered to be a slow process which requires a long period of time to develop a thick coating. High rate sputtering processes have recently been developed which increase the coating deposition rate. The nature of these processes is such that significant heat is generated in the target material. The heat may be sufficient to melt or crack the target material, therefore cooled targets must be employed.

Figure 1:
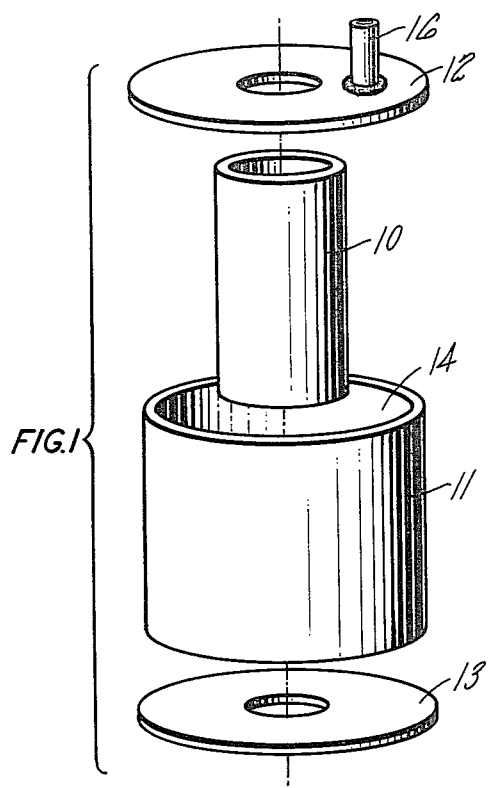
FIG. 1 shows an exploded view of the target container components prior to assembly.
Figure 2:
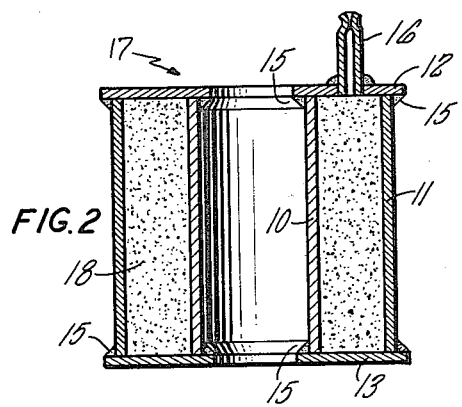
FIG. 2 shows a cross-sectional view of the target container after assembly, powder insertion and evacuation.

Sputtering is of interest for the deposition of corrosion resistant coatings on gas turbine engine components. Such coatings are of compositions which are extremely brittle in bulk form and are therefore difficult to fabricate. It is also important that compositional inhomogeneities in the target material be minimized so that the resulting coatings will be of uniform composition. This makes casting an undesirable fabrication technique. The present invention relates to a method for fabricating fluid cooled hollow sputtering targets and is especially suited for the production of such targets from brittle materials. Referring now to FIG. 1, there is shown an exploded view of the components which form and define the target fabrication container. These components include an inner shell 10 which is located concentrically within an outer shell 11. Both shell 10 and 11 components are substantially the same length. Top end component 12 and bottom end component 13 cooperate with the shell components 10 and 11 to define a toroidal volume 14 having a substantially rectangular cross section. These previously mentioned components are fabricated from a ductile metallic material selected to have vacuum integrity and to have high temperature properties which are compatible with the subsequent processing steps. At the temperature required to bond the target material particles together, the container material must have a low creep strength and a high creep rate so that it can conform to the target material as the target material shrinks in volume. For the fabrication of targets from the coating materials described below, the target container components are preferably fabricated from stainless steel of the 300 series. Although the inner and outer shell components are shown without seams, they may of course be fabricated from sheet material by bending and welding. The inner shell 10 and outer shell 11 are arranged in a concentric fashion on bottom end member 13 and the inner shell 10 and outer shell 11 are welded to the bottom end 13 using an appropriate joining process which will provide a vacuum tight joint. The volume 14 between the inner shell 10 and outer shell 11 is then filled with a powder material of the desired target composition and the top end 12 is placed over the assembly and joined thereto by a process which will provide a vacuum tight joint. Joints 15 are shown in FIG. 2 which shows the assembled target container assembly.

Of course other fabrication techniques can be employed to produce the outer container assembly. For example, inner and outer shell components 10 and 11 along with bottom end component 13 might be produced by deep drawing from sheet. The essential criteria is that the container be vacuum tight.

The top end 12 contains an evacuation tube 16 which extends through the top end 12 and communicates between the volume 14 and the exterior of the container.

The evacuation tube 16 forms a leak proof seal with the top end component 12. The evacuation tube 16 is connected to an evacuation apparatus, not shown, and a high vacuum is drawn in the volume 14 which contains the target material powder. After the desired high vacuum is attained, the evacuation tube 16 is sealed off for example by welding so as to maintain the powder containing volume 14 in an evacuated condition. The evacuation tube 16 is shown as penetrating the top end 12, however, it will be appreciated that the location of this tube is not critical and the particular location is not an essential feature of the invention. Of course, the container could be filled with powder and sealed in a vacuum chamber in which case the evacuation tube would be unnecessary.

Figure 3:
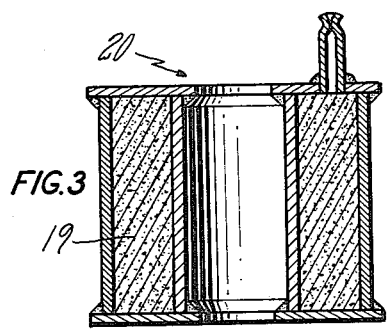
FIG. 3 shows the article of FIG. 2 after hot isostatic pressing.
Figure 4:
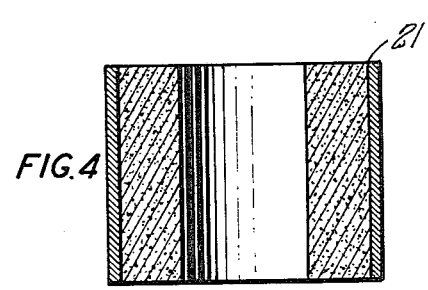
FIG. 4 shows the article of FIG. 3 after the removal of the inner and end container surfaces.

The container 17 is shown in FIG. 2 after it has been filled with powder 18 and evacuated. FIG. 2 and subsequent figures are cross sectional figures. The evacuated powder filled container 17 shown in FIG. 2 is placed in a pressure vessel (not shown) and treated under conditions of elevated temperature and pressure selected so that the powder 18 is compacted and bonded together to form a material having essentially no porosity. During the hot isostatic pressing sequence, the outer metal container shrinks and conforms to the compacted powder as a consequence of the difference in pressure. At the conclusion of the hot isostatic pressing step, the outer metal container will conform closely to the densified powder 19 and will be metallurgically bonded thereto. The hot isostatic pressed powder filled container 20 is shown in FIG. 3 and is shown as being somewhat smaller than shown in FIG. 2. Following the hot isostatic pressing step, those portions of the container corresponding approximately to the original inner shell component 10, top end 12 and bottom end 13 are removed from the densified target by means which may include machining, grinding and chemical removal. FIG. 4 shows the target after the removal step. The portion 21 of the container corresponding to the original outer shell 11 is retained on the outer periphery of the target and as previously noted it is metallurgically bonded to the target, thus providing good thermal and electrical contact between the container remnant and the target material.

Figure 6:
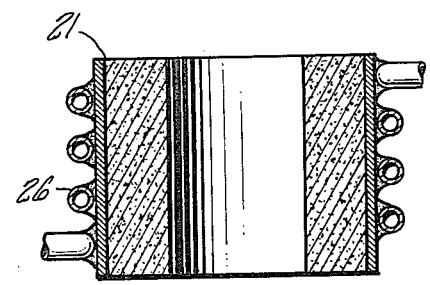
FIG. 6 shows an alternate cooling embodiment.

A fluid cooling jacket 22 is then fabricated and attached to the container remnant 21 as shown in FIG. 5. The cooling jacket shown in FIG. 5 is depicted in schematic form and includes inlet tube 23 and outlet tube 24 which can cooperate with an external fluid supply (not shown) to supply and remove fluid, such as water, from the cooling jacket. These components are preferably attached to the inner component 21 by a joining process which will produce a leak tight joint. Weld joints 25 are shown in FIG. 5. The details of the cooling jacket shown in FIG. 5 are exemplary rather than limiting and as those skilled in the art of heat transfer will appreciate, many similar cooling arrangements could be provided. For example, as shown in FIG. 6, a spiral of metal tubing 26 might be bonded to the metal component 21 to provide for heat extraction.

The procedure described has been used to fabricate cylindrical sputtering targets of material which is referred to as MCrAlY where M is chosen from the group consisting of Ni, Co, Fe and mixtures thereof. Nominal compositions by weight of MCrAlY materials are shown in Table I.

TABLE I

| Ni  | Co  | Cr   | Al   | Y  |
|-----|-----|------|------|----|
| Bal | 28  | 18   | 12.5 | .3 |
| Bal |     | 17   | 12   | .4 |
| —   | Bal | 19.5 | 12.5 | .5 |

These materials were provided in the form of powder having approximate size of −320 mesh and were encapsulated in one-quarter inch thick type 304 stainless steel to form a target similar to that depicted in the figures. The internal target diameter was approximately 14 inches, the height of the target was approximately 10 inches and the target material thickness was approximately 1 inch. The encapsulated powder was evacuated to a vacuum of about $10^{-3}$ mm and was hot isostatic pressed at a temperature of 2100° F and a pressure of 20,000 psi and a total cycle time of 8 hours. At the conclusion of this hot isostatic pressing operation, the MCrAlY powder was found to be completely bonded and fully dense. The undesired inner and end stainless steel container portions were removed by machining and an appropriate cooling jacket was fabricated by welding to the stainless steel portion surrounding the periphery of the target. The resultant target was crack free, of uniform composition, and had a fine grain microstructure. A target so fabricated was used to apply an MCrAly coating to several turbine blades.

Although described with reference to specific materials, it will be understood that these materials are explanatory rather than limiting and that this fabrication process has great general utility in the fabrication of sputtering targets of a wide variety of materials.

Having thus described a typical embodiment of our invention, that which we claim as new and desire to secure by Letters Patent of the United States is:

1. A method for fabricating a fluid cooled sputtering target including the steps of:
    a. providing a toroidal container formed from a ductile metal;
    b. filling the container with a powder material whose composition is that of the desired target;
    c. evacuating the filled container and sealing it so as to maintain the powder filled container in an evacuated condition;
    d. isostatically compacting the container at an elevated temperature selected so that the powder is densified and bonded to the container;
    e. removing the container from the densified powder material except for a remnant around the outer periphery;
    f. joining a fluid cooling means to the outer contour remnant.

2. A method as in claim 1 wherein the target material contains a material selected from the group consisting of iron, cobalt, and nickel and mixtures thereof, aluminum, chromium, and yttrium.

3. A method as in claim 1 wherein the fluid cooling means are joined to the outer periphery of the container prior to the isostatic pressing step and the interior of the cooling means is open to the isostatic pressing media.

* * * * *